United States Patent

Kumashiro

Patent Number: 6,006,026
Date of Patent: Dec. 21, 1999

[54] METHOD FOR SIMULATING IMPURITY DIFFUSION IN SEMICONDUCTOR WITH OXIDATION

[75] Inventor: Shigetaka Kumashiro, Tokyo, Japan

[73] Assignee: NEC Corporation, Tokyo, Japan

[21] Appl. No.: 08/915,598

[22] Filed: Aug. 21, 1997

[30] Foreign Application Priority Data

Aug. 22, 1996 [JP] Japan .................................. 8-241128

[51] Int. Cl.⁶ .................................................. G06F 9/455
[52] U.S. Cl. ................................ 395/500.23; 395/500.34; 364/468.28
[58] Field of Search ...................................... 364/578, 488, 364/489, 468.26, 468.28; 257/438, 386, 346; 345/419, 438; 395/500.23, 500.34

[56] References Cited

U.S. PATENT DOCUMENTS

| 5,502,643 | 3/1996 | Fujinaga ................................. 364/488 |
| 5,737,250 | 4/1998 | Sawahata .............................. 364/578 |
| 5,784,302 | 7/1998 | Kumashiro ............................ 364/578 |
| 5,819,073 | 10/1998 | Nakamura ............................. 395/500 |

OTHER PUBLICATIONS

M. Hane and K. Hane, Finite and Boundary Element Approach to Process Simulation with Conjugate Gradient–Based Method, IEEE Proceedings of the 5th Int'l Conf. on the Numerical Analysis of Semiconductor Devices and Integrated Circuits, 1987, pp. 219–224.

M. Kump and R. Dutton, The Efficient Simulation of Coupled Point Defect and Impurity Diffusion, IEEE Transactions on Computer–Aided Design, vol. 7, No. 2, Feb. 1988, pp. 191–204.

S. Odanaka et al., SMART–P: Rigorous Three–Dimensional Process Simulator on a Supercomputer, IEEE Transactions on Computer–Aided Design, vol. 7, No. 6, Jun. 1988, pp. 675–683.

B. Mulvaney et al., PEPPER—A Process Simuator for VLSI, IEEE Transactions on Computer–Aided Design vol. 8, No. 4, Apr. 1989, pp. 336–349.

E. Rorris et al., A New Approach to the Simulation of the Coupled Point Defects and Impurity Diffusion, IEEE Transactions on Computer–Aided Design, vol. 9, No. 10, Oct. 1990, pp. 1113–1122.

H. Sakamoto and S. Kumashiro, A New Diffusion Algorithm during Oxidation which can Handle both Phosphorus Pile–up and Boron Segregation at Si–SiO2 Interface, 1997 Int'l Conf. on Simulation of Semiconductor Processes and Devices, SISPAD '97, IEEE, pp. 81–84.

*Primary Examiner*—Eric W. Stamber
*Assistant Examiner*—Russell W. Frejd
*Attorney, Agent, or Firm*—Whitham, Curtis & Whitham

[57] ABSTRACT

A method for simulating a concentration of impurities within a semiconductor device while the semiconductor device is being oxidized includes setting a transition region in a part of the semiconductor device which is oxidized for a unit time period, and then calculating the concentration of impurities within the transition region by solving a diffusion equation using an impurity diffusion coefficient peculiar to the transition region, thus obtaining a redistribution of impurities within the transition region.

12 Claims, 10 Drawing Sheets

METHOD FOR SIMULATING IMPURITY DIFFUSION IN SEMICONDUCTOR WITH OXIDATION

BACKGROUND OF THE INVENTION

1. Field of the Invention

The present invention relates to a method for simulating an impurity diffusion in a semiconductor while the semiconductor is being oxidized.

2. Description of the Related Art

In a prior art method for simulating a concentration of impurities within a silicon material while the silicon material is being oxidized, first mesh points are set in a silicon oxide ($SiO_2$) region of the silicon material and second mesh points are set in a silicon (Si) region of the silicon material. Then, an old $SiO_2$/Si interface is advanced in said semiconductor material by a first distance determined by performing an oxidation operation upon the silicon material for a unit time period, so that a new $SiO_2$/Si interface is set in the semiconductor material. Then, the old $SiO_2$/Si interface is retarded by a second distance corresponding to a volume expansion of the semiconductor material determined by performing the oxidation operation upon the silicon material for the unit time period. In addition, an impurity transport flux by the motion of the $SiO_2$/Si interface is introduced, so that the effect of the impurity segregation at the $SiO_2$/Si interface can extend over a region where silicon oxide grows, thus enhancing the transport of impurities within this region. Thus, concentrations of impurities for the first mesh points are obtained by solving a first diffusion equation using a first impurity diffusion coefficient effective in $SiO_2$ and the impurity transport flux by the motion of the $SiO_2$/Si interface, and concentrations of impurities for the second mesh points are obtained by solving a second diffusion equation using a second impurity diffusion coefficient effective in Si. This will be explained later in detail (see D. A. Antoniadis et al., "Impurity Redistribution in $SiO_2$-Si during Oxidation: A Numerical Solution Including Interfacial Fluxes", Journal of the Electrochemical Society, Vol. 126, No. 11, pp. 1939–1945).

In the above-described prior art impurity diffusion simulation method, however, since the impurity transport flux by the motion of the $SiO_2$/Si interface is defined only between a mesh point at the new $SiO_2$/Si interface and another mesh point within $SiO_2$ adjacent to this mesh point, the distance between the old $SiO_2$/Si interface and the new $SiO_2$/Si interface determined by the time period is limited, since no additional mesh point is set between the old $SiO_2$/Si interface and the new $SiO_2$/Si interface. In addition, the above-described prior art impurity diffusion simulation method cannot be applied to a two-dimensional or three-dimensional impurity diffusion case.

SUMMARY OF THE INVENTION

It is an object of the present invention to provide a method for simulating an impurity diffusion in a semiconductor material while the semiconductor material is being oxidized, in which mesh points between an old interface and a new interface are not limited, and which can be applied to a multi-dimensional impurity diffusion case.

According to the present invention, in a method for simulating a concentration of impurities within a semiconductor device while the semiconductor device is being oxidized, a transition region is set in a part of the semiconductor device which is oxidized for a unit time period, and the concentration of impurities within the transition region is calculated by solving a diffusion equation using an impurity diffusion coefficient peculiar to the transition region, thus obtaining a redistribution of impurities within the transition region.

BRIEF DESCRIPTION OF THE DRAWINGS

The present invention will be more clearly understood from the description as set forth below, in comparison with the prior art, with reference to the accompanying drawings, wherein.

DESCRIPTION OF THE PREFERRED EMBODIMENT

Before the description of the preferred embodiment, a prior art impurity diffusion simulation method will be explained with reference to FIGS. 1, 2, 3A, 3B, 3C, 3D, 3E, 4A, 4B, 5A, 5B and 6.

Figure 1:
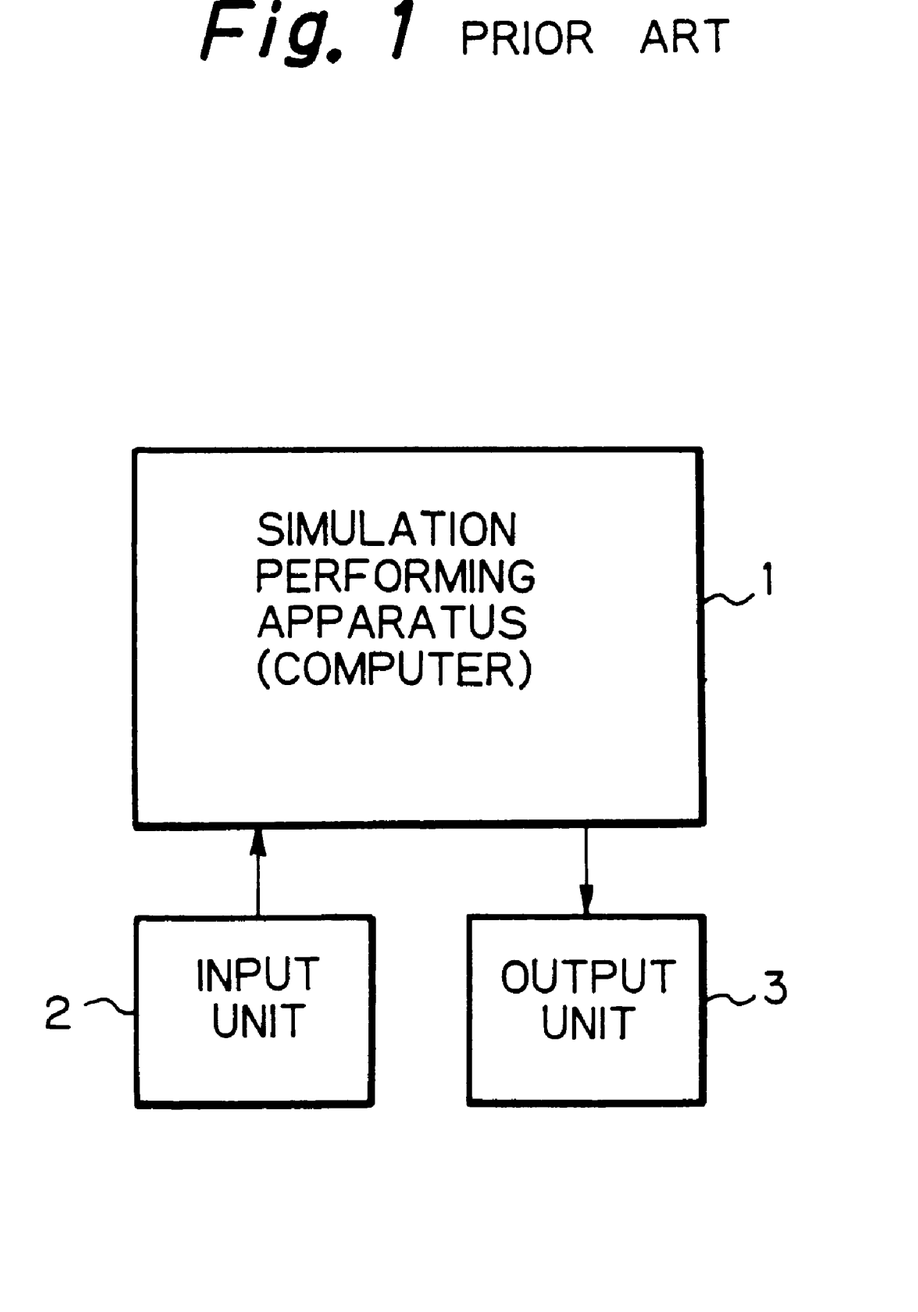
FIG. 1 is a block circuit diagram illustrating a prior art simulation system.
Figure 2:
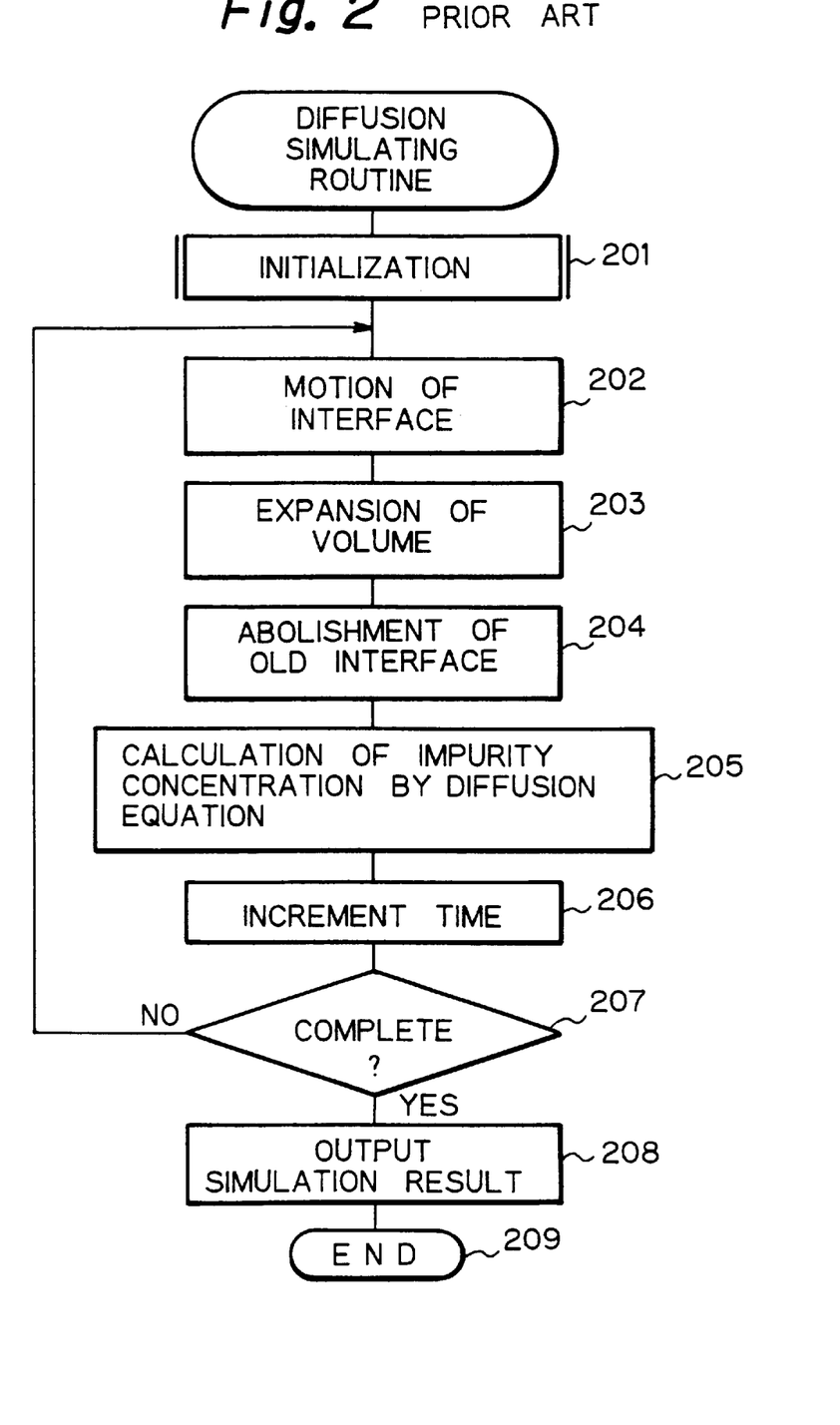
FIG. 2 is a flowchart showing a prior art impurity diffusion simulation method.

In FIG. 1, which illustrates a prior art simulation system, the simulation system is comprised of a simulation performing apparatus 1 such as a computer, an input unit 2 for inputting simulation initial values such as the thickness of a natural silicon oxide layer, a kind of impurity and so on, and an output unit 3 for outputting a simulation result and so on. The simulation performing apparatus 1 is comprised of a central processing unit (CPU), a read-only memory (ROM), a random access memory (RAM), and the like, FIG. 2 is a flowchart showing a prior art impurity diffusion simulating method carried out by the simulation performing apparatus 1 of FIG. 1 (see the D. A Antoniadis document). In FIG. 2, boron as impurity is implanted into silicon with oxidation, and a one-dimensional mesh is provided within a simulation region In this case, note that each element of the one-dimensional mesh is defined by a mesh point and a control region of the mesh point. Also, a boundary between two control regions is defined by a middle point of two mesh points of the two control regions. Also, in FIGS. 3A through 3E, the abscissa designates a depth, and the ordinate designates a boron concentration C. Further, as shown in FIGS. 3A through 3E, the positions indicated by the mesh points $P_1, P_2, \ldots$ in the ordinate are discretely representative of boron concentrations of their respective control regions.

Figure 3A:
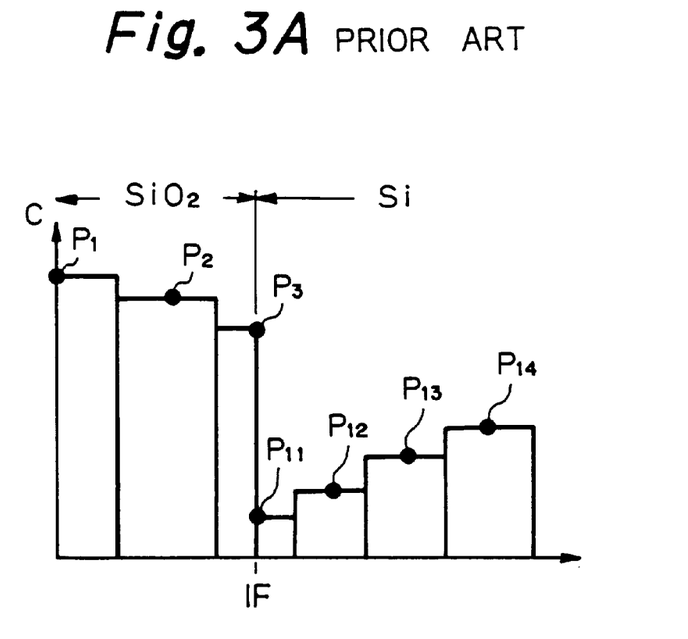
FIGS. 3A, 3B, 3C, 3D and 3E are impurity concentration diagrams for explaining the flowchart of FIG. 2.

First, at step 201, an initial state as shown in FIG. 3A is set. That is, mesh points $P_1, P_2$ and $P_3$ are set within a $S_iO_2$ layer which is, in this case, a natural silicon oxide layer, and mesh points $P_{11}$, $P_{12}$, $P_{13}$, $P_{14}$, . . . are set within a Si substrate. In this case, the mesh point $P_1$ is located on the surface of the $SiO_2$ layer, and the mesh point $P_3$ is located at an interface IF between the $SiO_2$ layer and the Si substrate. Also, the mesh point $P_{11}$, is located at the interface IF.

In FIG. 3A, note that the boron concentration at the mesh point $P_3$ having a control region in the $SiO_2$ layer is different from the boron concentration at the mesh point $P_{11}$ having a control region in the Si layer, due to the segregation of impurity at the interface IF created due to the difference in chemical potential between $SiO_2$ and Si.

Figure 3B:
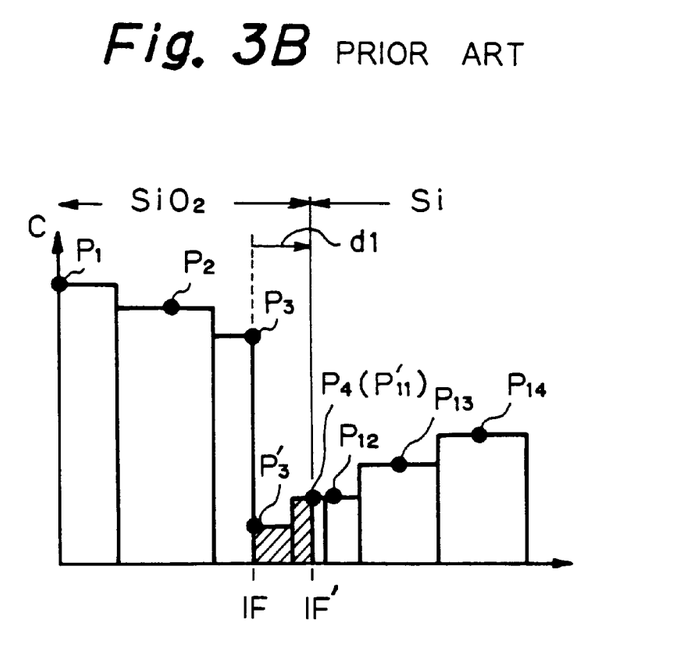

Next, at step 202, when assuming that the Si substrate is oxidized by oxygen, so that a part of the Si layer become silicon oxide, i.e., the $SiO_2$ layer grows, the interface between the $SiO_2$ layer and the Si substrate is moved to a location as indicated by IF' in FIG. 3B. The distance d1 between the old interface IF and the new interface IF' can be calculated by an analytical formula using the thickness and temperature of the $SiO_2$ layer and the oxygen concentration of oxygen atmosphere, or by a diffusion equation of oxygen within the $SiO_2$ layer and a reaction equation of oxygen and silicon at an interface therebetween.

Then, the mesh $P_{11}$ on the side of Si is converted into a mesh $P_3'$ on the side of $SiO_2$. Also, mesh points $P_4$ and $P_{11}'$ are set at the new interface IF'. In this case, the mesh point $P_4$ has a control region in the $SiO_2$ layer, and the mesh point $P_{11}$ has a control region in the Si substrate. In this case, since segregation of impurity has not been generated at the new interface IF' yet, the impurity concentration at the mesh point $P_4$ is the same as that at the mesh point $P_{11}'$.

Figure 3C:
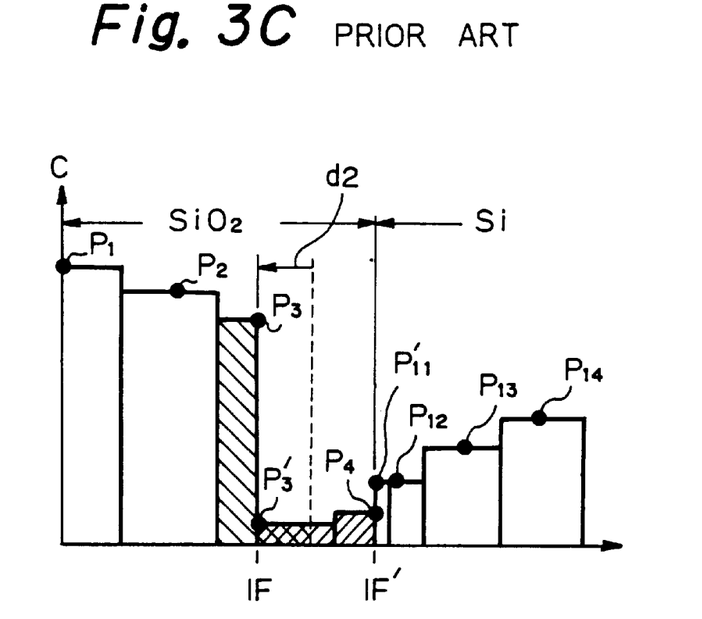

Next, at step 203, when silicon is converted into silicon oxide, the volume of the device is expanded That is, the old interface IF is retarded toward the surface of the device indicated by a distance d2 in FIG. 3C. In this case, it is assumed that no impurity flows through the interfaces IF and IF'. Therefore, since the amount of impurities between the interfaces IF and IF' as indicated by a right-handed shaded portion in FIG. 3C is the amount of impurities between the interfaces IF and IF' as indicated by a right-handed shaded portion in FIG. 3B, the impurity concentration at the mesh point $P_3'$ and the impurity concentration at the mesh point $P_4$ are both reduced.

Figure 3D:
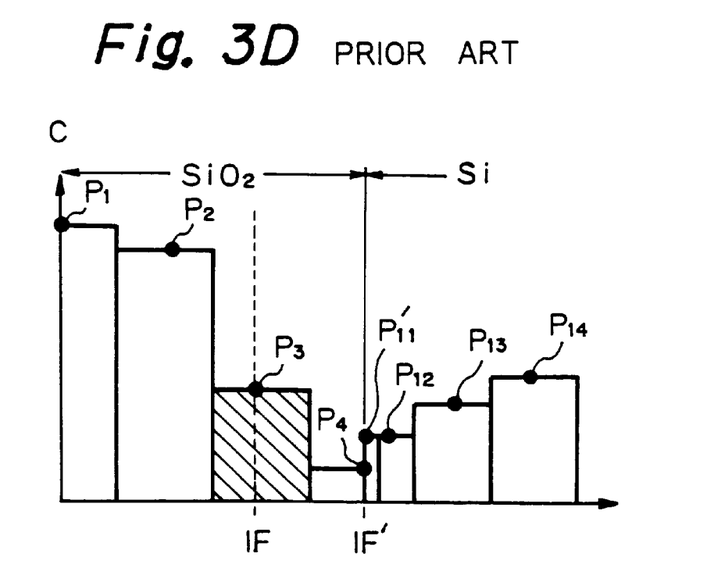

Next, at step 204, the old interface IF is abolished. That is, as shown in FIG. 3D, the mesh point $P_3'$ is abolished, and the impurity concentration at the mesh point $P_3$ is reduced. In this case, the amount of impurities of the control region belonging to the mesh point $P_3$ indicated by a left-handed shaded portion in FIG. 3C and the control region belonging to the mesh point $P_3'$ indicated by a cross-hatched portion in FIG. 3C are the same as that indicated by a left-handed shaded portion in FIG. 3D.

Next, at step 205, an impurity concentration C is calculated by the following diffusion equation:

$$\partial C/\partial t = -\text{div} \vec{F} \tag{1}$$

where $\vec{F} = D \text{ grad } C$, $\vec{F}$ is an impurity flux, and

Figure 3E:
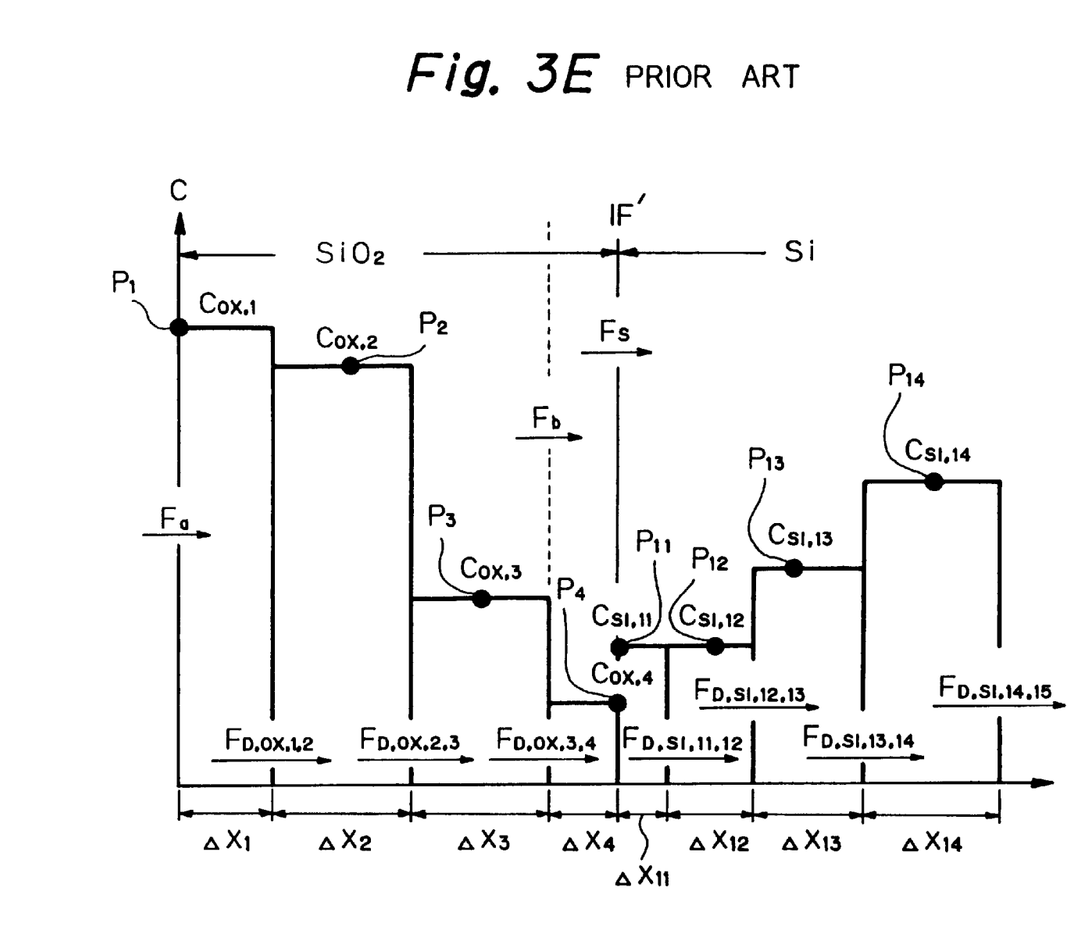

D is a diffusion constant of impurities. Concretely, each impurity concentration of the mesh points is calculated with reference to FIG. 3E. In Fig. 3E, note that the mesh point $P_{11}'$ of FIG. 3D is denoted simply by $P_{11}$, and "n" and "n−1" for showing times are omitted to simplify the description.

In FIG. 3E, the following are defined:

$\Delta x_i$ is a length of the control region belonging to the mesh point $P_i$;

$C_{ox, i}(n)$ is an impurity concentration of the mesh point $P_i$ within the $SiO_2$ layer at the current time ($t=n\Delta t$);

$C_{ox, i}(n-1)$ is an impurity concentration of the mesh point $P_i$ within the $SiO_2$ layer at a previous time ($t=(n-1) \Delta t$);

$C_{s1, i}(n)$ is an impurity concentration of the mesh point $P_i$ within the Si substrate at the current time;

$C_{s1, i}(n-1)$ is an impurity concentration of the mesh point $P_i$ within the Si substrate at the previous time;

$F_a(n)$ is an impurity transport flux at the surface of the $SiO_2$ layer from the atmosphere to the $SiO_2$ layer at the current time and is represented by $$F_a(n) = -h_a C_{ox, 1}(n) \tag{2}$$

where $h_a$ is an impurity transport coefficient from the oxygen atmosphere to the control region belonging to the mesh point $P_1$;

$F_{D, ox, i, i+1}(n)$ is an impurity transport flux from the control region belonging to the mesh point $P_i$ to the control region belonging to the mesh point $P_{i+1}$ within the $SiO_2$ layer and is represented by $$F_{D,ox,i,i-1}(n) = 2D_{ox}(C_{ox, i}(n) - C_{ox, i+1}(n))/(\Delta x_i = \Delta x_{i+1}) \tag{3}$$

where $D_{ox}$ is an impurity diffusion coefficient within the $S_iO_2$ layer;

$F_{D, SI, i, i+1}(n)$ is an impurity transport flux from the control region belonging to the mesh point $P_i$ to the control region belonging to the mesh point $P_{i+1}$ within the $S_i$ substrate and is represented by $$F_{D, SI, i, i+1}(n) = 2D_{SI}(C_{SI, i}(n) - C_{SI,i+1}(n))/(\Delta x_i + \Delta x_{i+1}) \tag{4}$$

where $D_{SI}$ is an impurity diffusion coefficient within the Si substrate;

$F_b(n)$ is an impurity transport flux by the motion of the $SiO_2/Si$ interface and is represented by $$F_b(n) = V_{ox}(\Delta t_b/(n\Delta t))X(C_{ox, i}(n) - \alpha C_{si,i}(n)) \tag{5}$$

where $V_{ox}$ is a motion speed of the $SiO_2/Si$ interface, $\Delta t_b$ is a time from a timing when he $SiO_2/Si$ interface enters into the control region belonging to the mesh point $P_{x1}$ to the current time, and α is a volume ratio of silicon to silicon oxide; and $F_s(n)$ is an impurity transport flux by impurity segregation at the $SiO_2/Si$ interface at the current time and is represented by $$F_s(n) = h_3(C_{ox, i}(n) - C_{si, i}(n)/m) \tag{6}$$

where $h_s$ is an impurity transport coefficient from the $SiO_2$ layer to the Si substrate, and m is a segregation coefficient at the $SiO_2/Si$ interface.

For the mesh point $P_1$ at the surface of the $SiO_2$ layer, the diffusion equation (1) is represented by $$(C_{ox, 1}(n) - C_{ox, 1}(n-1))/\Delta t = (F_a(n) - F_{D, ox 1, 2}(n))/\Delta x_1 \tag{7}$$

For the mesh point $P_2$ within the $SiO_2$ layer, the diffusion equation (1) is represented by $$(C_{ox, 2}(n) - C_{ox, 2}(n-1))/\Delta t = (F_{D,ox,1,2}(n) - F_{D,ox,2,3}(n))/\Delta x_2 \tag{8}$$

For the mesh point $P_3$ within the $SiO_2$ layer, the diffusion equation (1) is represented by $$(C_{ox,3}(n) - C_{ox,3}(n-1))/\Delta t = (F_{D,ox,2,3}(n) - F_{D,ox,3,4}(n) - F_b(n))/\Delta x_3 \tag{9}$$

For the mesh point $P_4$ at the interface of the $SiO_2$ layer and the Si substrate on the side of the $SiO_2$ layer, the diffusion equation (1) is represented by $$(C_{ox,4}\ (n)-C_{ox,4}\ (n-1))/\Delta t=(F_{D,ox,3,4}\ (n)+F_b\ (n)-F_S\ (n)/\Delta x_4 \quad (10)$$

For the mesh point $P_{11}$ at the interface of the $SiO_2$ layer and the Si substrate on the side of the Si substrate, the diffusion equation (1) is represented by $$(C_{SI,4}\ (n)-C_{SI,4}\ (n-1))/\Delta t=F_s\ (n)-F_{D,SI,11,12}\ (n))/\Delta x_{11} \quad (11)$$

For the mesh point $P_{12}$ within the Si substrate, the diffusion equation (1) is represented by $$(C_{SI,12}\ (n)-C_{SI,12}\ (n-1))/\Delta t=(F_{D,SI,\ 11,\ 12}\ (n))-F_{D,SI,12,13}\ (n))/\Delta x_{12}) \quad (12)$$

For the mesh point $P_{13}$ within the Si substrate, the diffusion equation (1) is represented by $$(C_{SI,\ 13}\ (n)-C_{SI,\ 13}\ (n-1))/\Delta t=(F_{D,SI,12,13}\ (n)-F_{D,SI,13,14}\ /\Delta x_{13} \quad (13)$$

For the mesh point $P_{14}$ within the Si substrate, the diffusion equation (1) is represented by $$(C_{SI,14}\ (n)-C_{SI,14}\ (n-1))/\Delta t=(F_{D,SI,13,14}\ (n)-F_{D,SI,14,15}\ (n))/\Delta x_{14} \quad (14)$$

The simultaneous linear equations (7) through (14) including the linear equations (2) through (6) can be easily solved to obtain the impurity concentrations $C_{ox,\ 1}$ (n), $C_{ox,\ 2}$ (n), ..., $C_{SI,\ 11}$ (n), $C_{SI,12}$(n), ...

Next, at step 206, a time period t is incremented by $$t \leftarrow t+\Delta t.$$

Next, at step 207, it is determined whether or not the total time period $n-\Delta t$ reaches a predetermined time period. As a result, if the predetermined time period has passed, the control proceeds to step 208. Otherwise, the control returns to step 202, thus repeating the above-mentioned operations at steps 202 to 206.

At step 208, a simulation result is outputted to the output unit 3.

Then, the routine of FIG. 2 is completed by step 209.

Figure 4A:
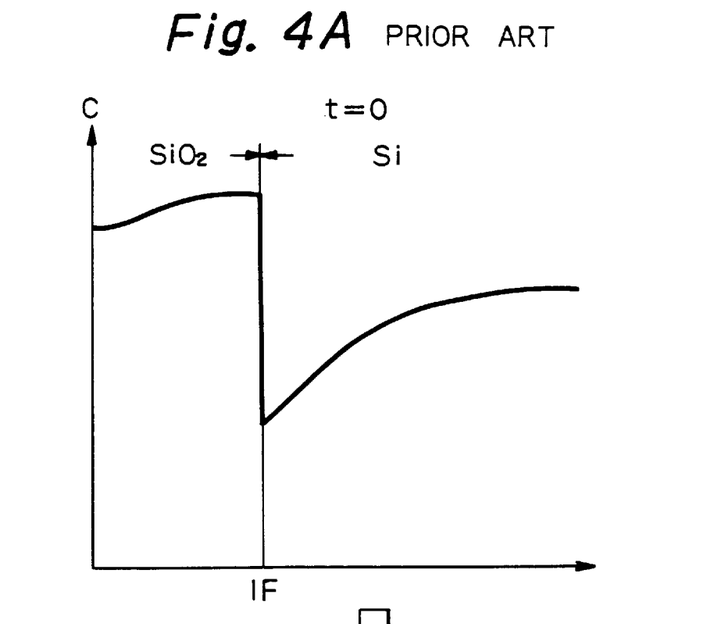
FIGS. 4A and 4B are diagrams for showing a change in impurity concentration without introducing an impurity transport flux by the motion of the $SiO_2$/Si interface.
Figure 4B:
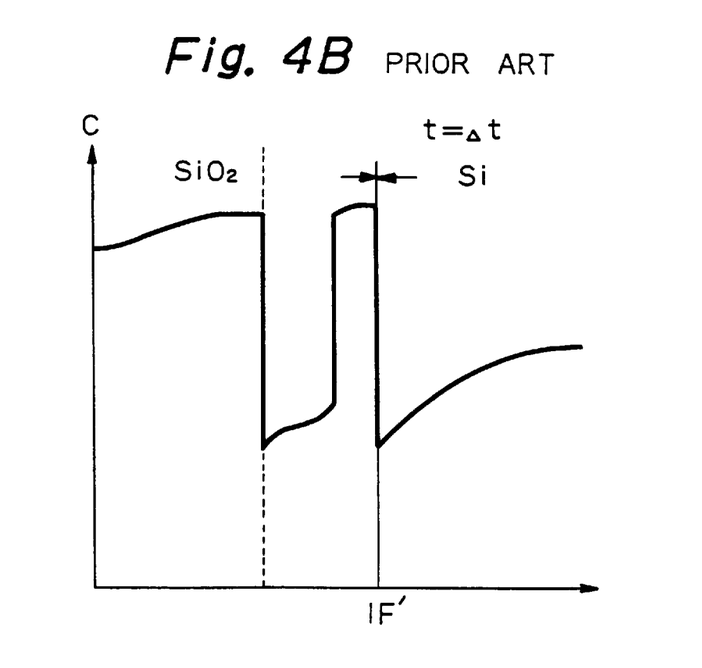
Figure 5A:
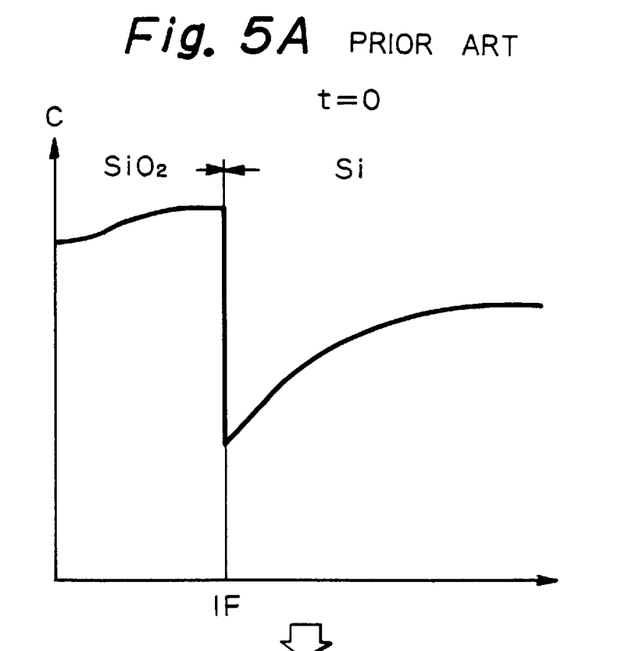
FIGS. 5A and 5B are diagrams for showing a change in impurity concentration with introduction of an impurity transport flux by the motion of the $SiO_2$/Si interface.
Figure 5B:
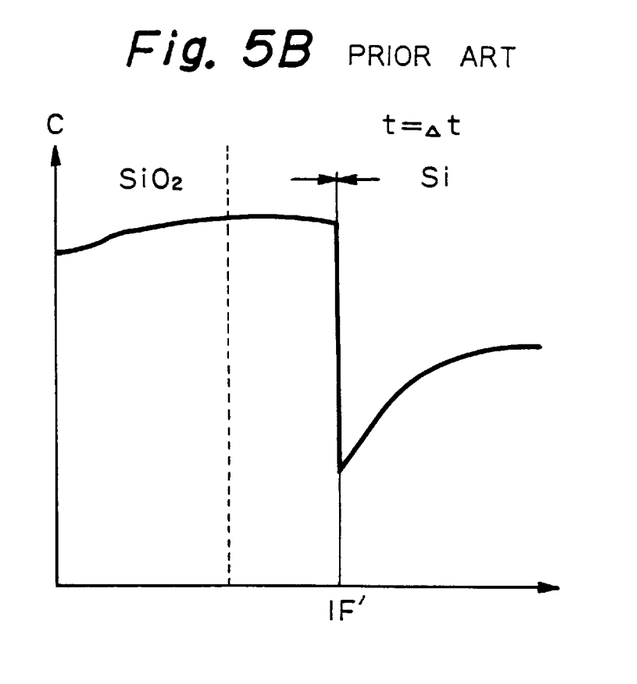

In the above-described prior art impurity diffusion simulation method, the impurity transport flux $F_b$ by the motion of the $S_tO_2$/Si interface is introduced, so that the effect of the impurity segregation at the $SiO_2$/Si interface can extend over a region where silicon oxide grows, thus enhancing the transport of impurities within this region. That is, if the impurity diffusion simulation method is carried out without introducing the impurity transport flux $F_b$, since the fluxes $F_S$ and $F_b$ are larger than the flux $F_{D,ox,3,4}$, the segregation effect of impurities such as borons generates only at the $SiO_2$/Si interface, so that the impurity concentration is spiked at the $SiO_2$/Si interface as shown in FIGS. 4A and 4B, which is not close to a practical impurity concentration distribution. In this case, note that the simulation result is further away from the practical impurity concentration distribution as the simulation is advanced. Contrary to this, if the impurity diffusion simulation method is carried out with introduction of the impurity transport flux $F_b$, the impurity concentration can be obtained as shown in FIGS. 5A and 5B which is close to the practical impurity concentration distribution.

In the above-described prior art impurity diffusion simulation method, however, since the impurity transport flux $F_b$ is defined only between the mesh point $P_4$ at the new $SiO_2$/Si interface IF' and the mesh point $P_3$ within the $Sio_2$ layer adjacent to the mesh point $P_4$, the distance d1 between the old $SiO_2$/Si interface IF and the new $SiO_2$/Si interface IF' determined by the time period $\Delta t$ is limited, since no additional mesh point is set between the old $SiO_2$/Si interface IF and the new $SiO_2$/Si interface IF'. Note that, if a mesh point is set between the old $SiO_2$/Si interface IF and the new $SiO_2$/Si interface IF', since no impurity transport flux $F_b$ is introduced between this set mesh point and the mesh point on the new $SiO_2$/Si interface IF', adjacent to this set mesh point, a similar spike as shown in FIGS. 4B also appears in the impurity concentration.

Also, if the distance d1 between the old $SiO_2$/Si interface IF and the new $SiO_2$/Si interface IF' is sufficiently small, no problem occurs, which, however, increases the simulation time. Contrary to this, if the spacing between the mesh points is increased to enlarge the distance d1 between the old $SiO_2$/Si interface IF and the new $SiO_2$/Si interface IF', the accuracy of the impurity concentration distribution is reduced.

Figure 6:
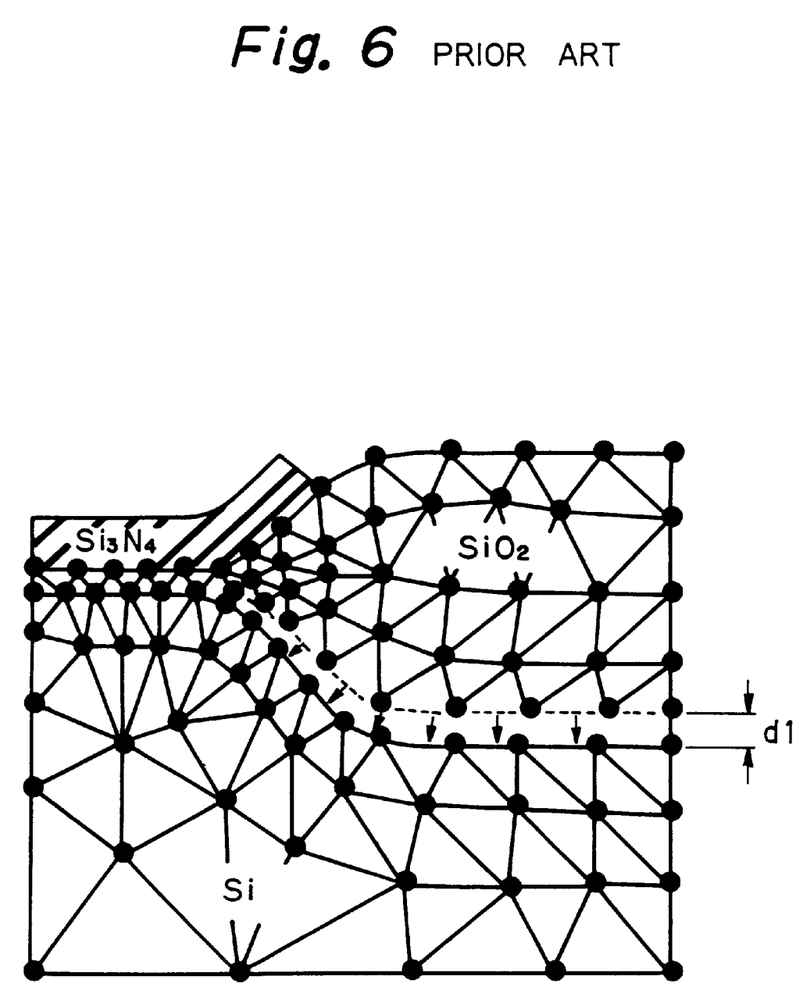
FIG. 6 is a diagram illustrating a relationship between a two-dimensional mesh configuration and a motion of the $SiO_2$/Si interface.

In addition, the above-described prior art impurity diffusion simulation method cannot be applied to a two-dimensional or three-dimensional impurity diffusion case. That is, each impurity transport flux $F_b$ by the interface motion is defined along one branch linking two mesh points. Therefore, in a one-dimensional impurity diffusion case, a direction of each impurity transport flux $F_b$ always coincides with a direction of a row of mesh points, i.e., a motion direction of the $SiO_2$/Si interface. Contrary to this, in a two-dimensional impurity diffusion case as shown in FIG. 6, since a triangular mesh configuration is adopted, a direction of each impurity transport flux $F_b$ along one mesh branch does not always coincide with a motion direction of the $SiO_2$/Si interface. Therefore, an adequate approximation technique has to be adopted to define each impurity transport flux $F_b$. Otherwise, the simulation result becomes inaccurate.

Figure 7:
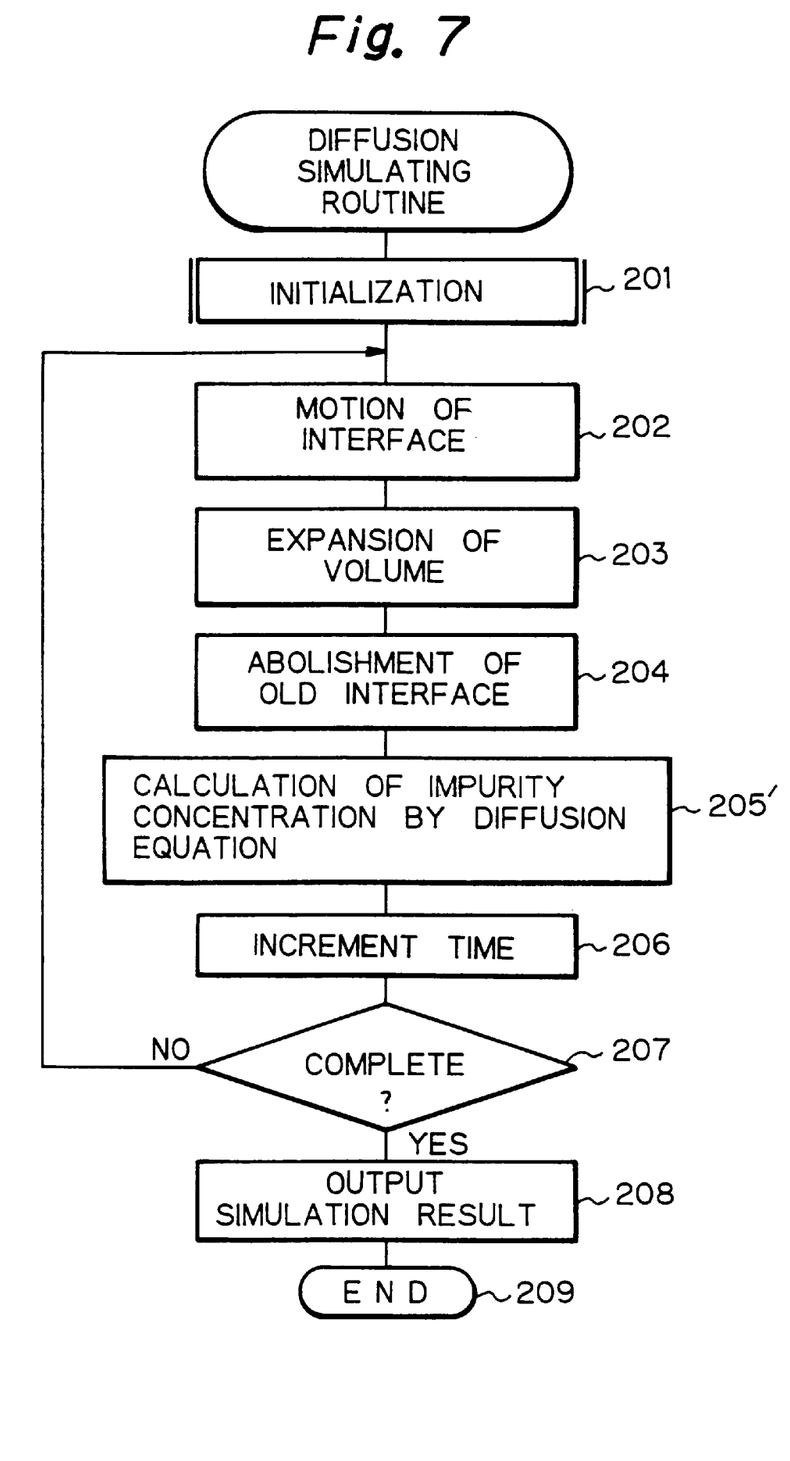
FIG. 7 is a flowchart showing an embodiment of the impurity diffusion simulation method according to the present invention.
Figure 8:
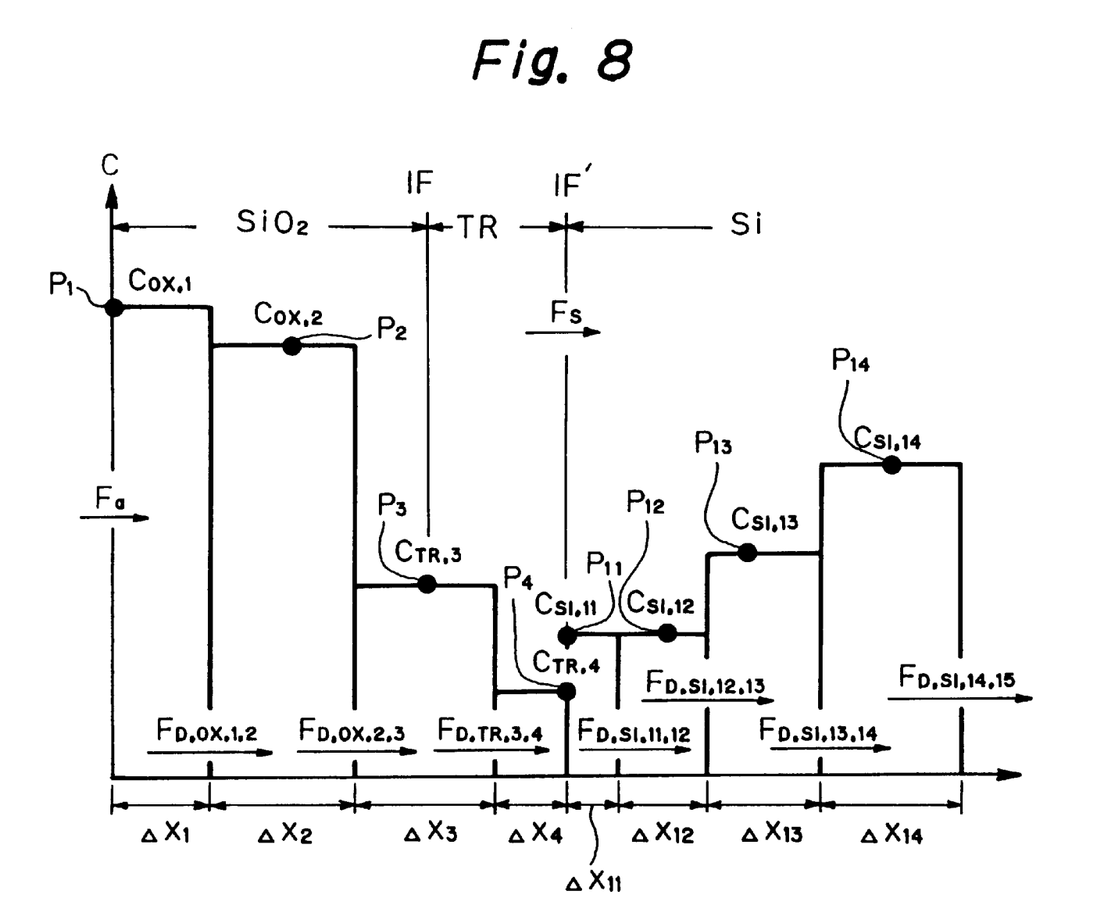
FIG. 8 is a impurity concentration diagram for explaining the flowchart of FIG. 7.

In FIG. 7, which illustrates a first embodiment of the present invention, step 205 of FIG. 2 is modified into step 205' where each impurity concentration of the mesh-points is calculated with reference to FIG. 8. Note that FIG. 8 corresponds to FIG. 3E.

In FIG. 8, a transition region TR is set between the old $SiO_2$/Si interface IF and the new $SiO_2$/Si interface IF', and impurity concentrations at the boundary and within the transition region TR are denoted by $C_{TR,\ 3}$ and $C_{TR,4}$, for example. Note that the number of control regions within the transition region TR can be more than 2.

Also, in FIG. 8, instead of the impurity transport flux $F_{D,ox,3,4}$ (n) and the impurity transport flux $F_b$ (n) of FIG. 3E, an impurity tremsport flux $F_{D,TR,3,4}$ (n) is introduced between the control region belonging to the mesh point $P_3$ and the control region belonging to the mesh point $P_4$ within the transition region TR and is generally represented by $$F_{D,TR,i,i+1}\ (n)=2D_{TR}\ (C_{TR,i}\ (n)-C_{TR,i+i}(n))/(\Delta x_i+\Delta x_{i+i}) \quad (15)$$

where $D_{TR}$ is an impurity diffusion coefficient within the transition region TR, which will be explained later. In this case, note that, if the number of control regions within the transition region TR is more than 2, more than one impurity transport flux $F_{D,TR,i,i+1}$ (n) is introduced into the transition region TR. Also, the equation (6) is replaced by $$F_s\ (n)=h_s(C_{TR,i}\ (n)-C_{SI,i}\ (n)/m) \quad (6)'$$

At step 205' of FIG. 7, for the mesh points $P_1$, $P_2$, $P_{11}$, $P_{12}$, $P_{13}$ and $P_{14}$, the diffusion equation (1) is represented by the equations (7), (8), (11), (12), (13) and (14), respectively, in the same way as at step 205 of FIG. 2. Also, for the mesh point $P_3$ at the boundary between the $SiO_2$ layer and the transition region TR, the diffusion equation (1) is represented by $$(C_{TR,3}(n)-C_{TR,\ 3}\ (n-1))/\Delta t=(F_{D,ox,2,3}\ (n)-F_{D,TR,3,4}\ (n))/\Delta x_3 \quad (9)'$$

Further, for the mesh point $P_4$ within the transition region TR adjacent to the Si substrate, the diffusion equation (1) is represented by $$(C_{TR,4}(n)-C_{TR,4}(n-1))/\Delta t=(F_{D,TR,3,4}(n)-F_S(n))/\Delta x_3 \quad (10)'$$

Note that, for a mesh point $P_i$ within the transition region TR which is not adjacent to the SiO$_2$ layer and the Si substrate, the diffusion equation (1) can be represented by $$(C_{TR,i}(n)-C_{TR,i}(n-1))/\Delta t=(F_{D,TR,i-1,i}(n)-F_{D,TR,i,i+1}(n))\Delta x_i$$

The impurity diffusion coefficient $D_{TR}$ is preset to satisfy a condition that the magnitude of the impurity transport flux $F_{D,TR,i,i+1}(n)$ such as $F_{D,TR,3,4}(n)$ is close to be the magnitude of the impurity transport flux $F_b(n)$ of FIG. 3E. For example, $$D_{TR}=(V_{ox}^2/6)\cdot\Delta t \quad (16)$$

Note that, generally, $$|F_S(n)|>|F_{D,SI,i,i+1}(n)|>|F_{D,ox,i,i+1}(n)| \quad (17)$$

$$|F_{D,TR,i,i+1}(n)|>|F_{D,SI,i,i+1}(n) \quad (18)$$

The impurity diffusion coefficient $D_{TR}$ defined by the equation (16) can satisfy the equations (17) and (18).

The impurity diffusion coefficient $D_{TR}$ can be preset to satisfy a condition that the magnitude of the impurity transport flux $F_{D,TR,i,i+1}(n)$ such as $F_{D,TR,3,4}(n)$ is close to the magnitude of the impurity transport flux $F_S(n)$. For example, $$D_{TR}=(h_s^2/6)\cdot\Delta t \quad (19)$$

In view of the equations (16) and (19), the impurity diffusion coefficient $D_{TR}$ can be defined by $$D_{TR}=MAX[(h_s^2/6)\cdot\Delta t, (V_{ox}^2/6)\cdot\Delta t] \quad (20)$$

The simultaneous linear equations (7), (8), (9)', (10)', (11) through (14) including the linear equations (2) through (5), (6)' and (15) can be easily solved to obtain the impurity concentrations $C_{ox,1}(n)$, $C_{ox,2}(n)$, $C_{TR,3}(n)$, $C_{TR,4}(n)$, $C_{SI,11}(n)$, $C_{SI,12}(n)$, . . .

As explained hereinabove, according to the present Invention, since additional mesh points can be set between an old interface and a new interface, the distance between the old interface and the new interface per unit time period is not limited. In addition, since impurity transport within the old interface and the new interface is defined by impurity diffusion fluxes between control regions set in the old interface and the new interface, the impurity diffusion simulation method according to the present invention can be applied to a multi-dimensional impurity diffusion case.

I claim:

1. A method for simulating, on a computer, a concentration of impurities within a semiconductor device while said semiconductor device is being oxidized, wherein a transition region is set in a part of said semiconductor device which is oxidized for a unit time period, and a concentration of impurities within said transition region is calculated by solving a diffusion equation using an impurity diffusion coefficient peculiar to said transition region, thus obtaining a redistribution of said impurities within said transition region.

2. The method as set forth in claim 1, wherein said impurity diffusion coefficient is defined by $$D_{TR}=(V_{ox}^2/6\cdot\Delta t$$

where $V_{ox}$ is a motion speed of a semiconductor oxide/semiconductor interface within said semiconductor device, and $\Delta t$ is said unit time period.

3. The method as set forth in claim 1, wherein said impurity diffusion coefficient is defined by $$D_{TR}=(h_s^2/6)\cdot\Delta t$$

where $h_s$ is an impurity transport coefficient of said impurities from a semiconductor oxide to semiconductor interface within said semiconductor device, and $\Delta t$ is said unit time period.

4. The method as set forth in claim 1, wherein said impurity diffusion coefficient is defined by $$D_{TR}=MAX[(V_{ox}^2/6)/\Delta t, (h_s^2/6)\cdot\Delta t]$$

where $V_{ox}$ is a motion speed of a semiconductor oxide/semiconductor interface within said semiconductor device, $h_s$ is an impurity transport coefficient of said impurities from said semiconductor oxide to semiconductor interface within said semiconductor device, and $\Delta t$ is said unit time period.

5. The method as set forth in claim 1, wherein said transition region is disposed between first and second interfaces.

6. The method as set forth in claim 5, wherein said first interface corresponds to an SiO$_2$/Si interface in existence before oxidation of said semiconductor device and said second interface corresponds to an SiO$_2$/Si interface formed after said oxidation.

7. The method as set forth in claim 6, further comprising:
setting at least one mesh point in said transition region, and wherein the concentration of impurities in said transition region is calculated by calculating an impurity concentration at said least one mesh point based on said peculiar impurity diffsion coefficient.

8. The method as set forth in claim 6, wherein the concentration of impurities within said transition region is computed in accordance with an impurity transport flux that coincides with at least one of a two-dimensional and three-dimensional motion direction of said second SiO$_2$/Si interface during said oxidation.

9. A method for simulating, on a computer, a concentration of impurities within a semiconductor material while said semiconductor material is being oxidized, comprising the steps of:

setting first mesh points in a semiconductor oxide region of said semiconductor material and setting second mesh points in a semiconductor region of said semiconductor material;

advancing a first interface between said semiconductor oxide and said semiconductor in said semiconductor material by a first distance determined by performing an oxidation operation upon said semiconductor material for a unit time period, so that a second interface is set in said semiconductor material;

retarding said first interface by a second distance corresponding to a volume expansion of said semiconductor material determined by performing said oxidation operation upon said semiconductor material for said unit time period;

setting a transition region in a part of said semiconductor material between said retarded first interface and said second interface and setting third mesh points in said transition region;

calculating concentrations of said impurities for said first mesh points by solving a first diffusion equation using a first impurity diffusion coefficient effective in said semiconductor oxide;

calculating concentrations of said impurities for said second mesh points by solving a second diffusion equation using a second impurity diffusion coefficient effective in said semiconductor;

calculating concentrations of said impurities for said third mesh points by solving a third diffusion equation using a third impurity diffusion coefficient effective in said transition region; and thus obtaining a redistribution of said impurities within said transition region.

10. The method as set forth in claim 9, wherein said third impurity diffusion coefficient is defined by $$D_{TR}=(V_{ox}^2/6)\cdot \Delta t$$

where $V_{ox}$ is a speed of advancing from said first interface to said second interface within said, semiconductor material, and $\Delta t$ is said unit time period.

11. The method as set forth in claim 9, wherein said third impurity diffusion coefficient is defined by $$D_{TR}=(h_s^2/6)\cdot \Delta t$$

where $h_s$ is an impurity transport coefficient of said impurities from said semiconductor oxide region to said semiconductor region within said semiconductor material, and $\Delta t$ is said unit time period.

12. The method as set forth in claim 9, wherein said third impurity diffusion coefficient is defined by $$D_{TR-MAX}[(V_{ox}^2/6)/\Delta t,\ (h_s^2/6)\cdot \Delta t\ ]$$

where $V_{ox}$ is a speed of advancing from said first interface to said second interface within said semiconductor material, $h_s$ is an impurity transport coefficient of said impurities from said semiconductor oxide region to semiconductor region within said semiconductor material, and $\Delta t$ is said unit time period.

* * * * *